United States Patent [19]

Ishiyama

[11] Patent Number: 5,227,607
[45] Date of Patent: Jul. 13, 1993

[54] YAG LASER WORKING MACHINE FOR PRECISION WORKING OF THIN-FILM

[75] Inventor: Noritaka Ishiyama, Inagi, Japan

[73] Assignees: Mid Co., Ltd., Kanagawa, Japan; JVF Inc., Grand Cayman, Cayman Islands

[21] Appl. No.: 838,723

[22] Filed: Mar. 12, 1992

[30] Foreign Application Priority Data

Jul. 31, 1990 [JP] Japan ................................. 2-201381
Dec. 26, 1990 [JP] Japan ................................. 2-414117
Dec. 26, 1990 [JP] Japan ................................. 2-414118

[51] Int. Cl.$^5$ .............................................. B23K 26/00
[52] U.S. Cl. ........................... 219/121.68; 219/121.73; 219/121.75; 219/121.82
[58] Field of Search ................... 219/121.61, 121.68, 219/121.73, 121.75, 121.7, 121.71, 121.82

[56] References Cited

U.S. PATENT DOCUMENTS

| | | | |
|---|---|---|---|
| 4,752,668 | 6/1988 | Rosenfield et al. | 219/121.68 |
| 4,843,209 | 6/1989 | Milligan | 219/121.63 |
| 5,095,190 | 3/1992 | Aketagawa et al. | 219/126.78 |
| 5,140,128 | 8/1992 | Jonei et al. | 219/121.72 |

Primary Examiner—C. L. Albritton
Attorney, Agent, or Firm—Jordan and Hamburg

[57] ABSTRACT

This invention relates to a YAG laser working machine, and an object thereof is to enable highly precise processing such as one required for processing of a photomask which is used at, for example, a step of manufacturing semiconductors. The YAG laser working machine according to this invention is such that a machine body is provided with restriction means for reducing a beam diameter of a laser beam, is provided with shutter means for executing ON-OFF control of application of the laser beam at a location on the outside of the oscillator, and is provided with highly harmonizing means for the laser beam. A base disk on which the machine body is mounted is formed of solid stone, and is mounted on a plurality of legs through interposition of respective pneumatic springs. Pulse signals regarding the X-movement and the Y-movement of an XY-table are processed by an OR circuit. Pulse application of the laser beam is controlled on the basis of the signals processed by the OR circuit.

6 Claims, 2 Drawing Sheets

YAG LASER WORKING MACHINE FOR PRECISION WORKING OF THIN-FILM

DESCRIPTION

1. Technical Field

This invention relates to YAG laser working machines and, more particularly to a YAG laser working machine for thin-film precision processing, which is suitable for processing such as direct drawing of a fine or minute pattern in a printed-circuit-board manufacturing step and a semiconductor manufacturing step, for example.

2. Background Art

A YAG laser is characterized in that an oscillation wavelength is a relatively short wavelength such as 1.06 μm, a high mean output is liable to be produced, and further, an apparatus is relatively compact, or the like. The YAG laser has widely been utilized in fields of small-article processing and fine processing.

Although it is said as being the fine processing, however, fine processing which has conventionally been possible is, for example, taking an example of a field of manufacturing of semiconductors, one like marking processing of IC packages, and repair or processing of correcting or retouching defects in a photomask which is used in a manufacturing step of IC. It cannot necessarily be said as being utilization in which the ability and characteristics thereof are sufficiently utilized.

In view of the above, the inventor of the present application has advanced development of a YAG laser working machine in which a characteristic of the YAG laser is sufficiently utilized so that highly-precise fine processing is made possible, and a pattern can directly be drawn onto a photomask which is used in a manufacturing step of printed circuit boards having high packaging density and in a manufacturing step of semiconductors, for example.

That it becomes a great problem in realization of such highly precise fine processing is making-into-fineness or miniaturization and making-into-precision of a diameter of the laser beam applied to a workpiece. For this purpose, a problem is how efficiently a beam diameter is narrowed or reduced or is made fine. Further, a problem is how the produced fine beam can be processed under a stable condition, that is, under an always constant condition in which variation in processing due to a change in processing speed and oscillation of an apparatus, variation in oscillating condition of an oscillator is less, and the like.

Specifically this invention has an object to provide a YAG laser working machine for precisely processing thin films, like one in which the above-discussed various problems can be solved whereby processing of one such as photomasks or the like used in a semiconductor manufacturing step is made possible.

DISCLOSURE OF THE INVENTION

A YAG laser working machine for precisely processing a thin film, according to the invention, comprises a machine body in which a laser beam oscillated by an oscillator of Q-switch oscillation is led by an optical system having a plurality of lenses, and is condensed in the form of a spot by a condenser arranged at a forward end of the optical system, so as to be applied to a workpiece, an XY-table on which the workpiece is mounted, and a base disk on which the machine body and the XY-table are mounted, wherein the machine body is provided with restriction means at a location between the plurality of lenses forming the optical system, for cutting off an outer peripheral portion of the laser beam to reduce a beam diameter thereof.

According to the YAG laser working machine, the outer peripheral portion of the laser beam is cut off by the restriction means, whereby the beam diameter is reduced. This, however, is based on such knowledge that, even if this outer peripheral portion is dumped, no influence is practically so much exerted upon processing energy efficiency in view of energy distribution in case of the thin-film processing. Further, by the fact that the beam diameter is reduced in this manner, bad or defect components having random peaks, which are included or contained in the outer peripheral portion of the laser beam, can be removed so that the beam spot can be brought to further precise one.

The reason why the restriction means is arranged between the lenses of the optical system is to avoid damage of the restriction means due to the laser beam. Specifically, since the laser beam enlarged between the lenses of the optical system is reduced in energy density in accordance with a magnification ratio, it can be dispensed with that the restriction means is not subjected to damage if the laser beam is under enlargement.

It is preferable in the YAG laser working machine constructed as described above that the machine body is provided with shutter means for executing ON-OFF control of application of the laser beam so as to be positioned at a location on the outside of the oscillator.

Specifically, by doing so, it is possible to execute ON-OFF control of application of the laser beam by the shutter means which is arranged on the outside of the oscillator. It can be dispensed with that stopping-starting of the oscillator are executed during processing operation. As a result, it is possible to execute precision processing further stably. Specifically, although Q-switch oscillation can produce stable oscillation when the Q-switch oscillation generally executes oscillation continuously, the Q-switch oscillation has a property that an output is unstabilized at an initial stage of starting beginning in use and starting after oscillation has been stopped on the halfway. This slight unstabilization of the output exerts no little affection or influence upon the precision processing of the thin film. However, according to the present machine, it can be dispensed with that stopping-starting of the oscillator are not executed during processing. Thus, it is possible to avoid influence of the unstabilization of the output at the initial stage of starting.

Further, it is preferable for such YAG laser working machine that the machine body is provided with highly harmonizing means for bringing the laser beam to a high harmonic wave.

Specifically, by the fact that the laser beam is brought to the high harmonic wave, further miniaturization of the diameter of the beam spot can be realized. The miniaturization of the diameter of the beam spot due to this high harmonic wave causes a great or rapid change as compared with a case of a fundamental wavelength of 1.06 μm, regarding processing of the thin film. Specifically, although it is natural that the diameter can be reduced mechanically, making-into-high-density of the energy produced by high harmonization has an unexpected aptitude with respect to processing of the thin film. It will be possible to perform a precise processing like one in which occurrence of dross is liable to occur in case of the fundamental wavelength does not entirely appear.

Furthermore, it is preferable for such YAG laser working machine that the base disk is formed of solid stone, and is mounted on a plurality of legs by interposition of respective pneumatic springs.

Specifically, by the fact that the base disk is formed in this manner, the base disk is extremely stabilized with respect to oscillation. It is possible to execute further accurately application of the minute spot beam produced by the aforesaid respective elements to the workpiece, making it possible to further improve precision of the processing.

Moreover, it is further preferable for such YAG laser working machine that data regarding X-movement and Y-movement of the XY-table are obtained as pulse signals by an encoder, the data are processed by an OR circuit, and pulse application of the laser beam is controlled on the basis of an output from the OR circuit.

Specifically, by such control pulse application of the laser beam can be executed by the constant distance intervals regardless of the X·Y-movements. Thus, a phenomenon called unstabilization of the cutting-off condition due to fluctuation of the moving speed of the workpiece can be avoided. Effectiveness of the minute spot beam produced by the aforesaid respective elements can further be put to practical use. An attempt can be made to further improve precision of the processing.

BEST MODE FOR CARRYING OUT THE INVENTION

An embodiment of the invention will be described below.

Figure 1:
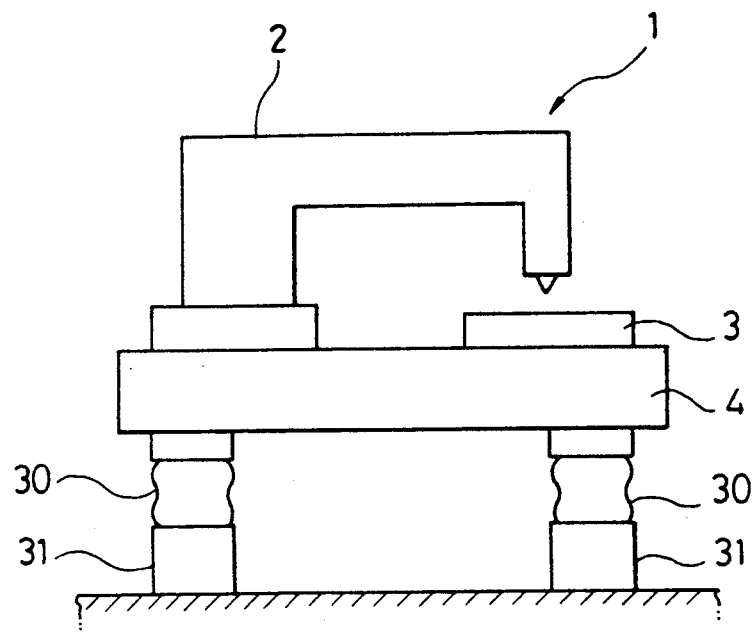
FIG. 1 is a side elevational view of a YAG laser working machine.

A YAG laser working machine 1 according to the embodiment comprises a machine body 2, an XY-table 3 and a base disk 4 on which the machine body 2 and the XY-table 8 are mounted, as shown in FIG. 1.

Figure 2:
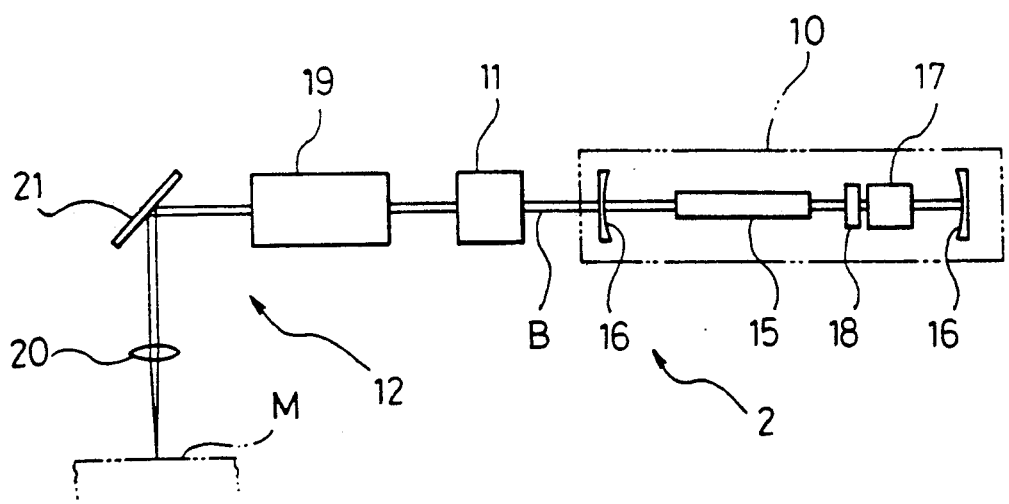
FIG. 2 is a schematic arrangement view of a machine body.
Figure 3:
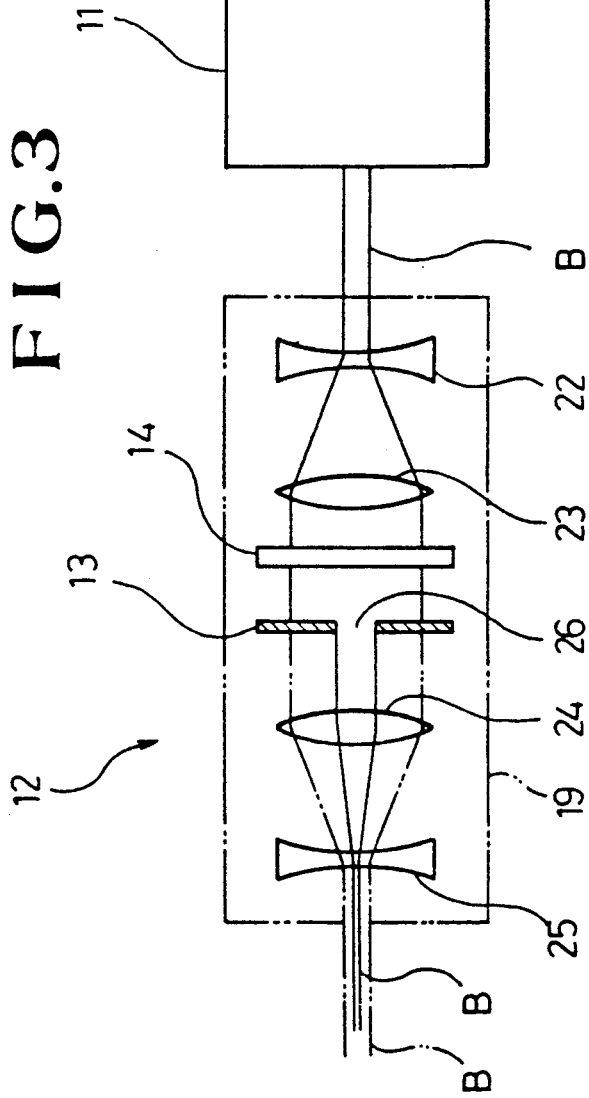
FIG. 3 is a schematic arrangement view showing a relationship between a parallelizing optical system, and throttle or restriction means and shutter means.

As illustrated in FIG. 2, the machine body 2 is provided with an oscillator 10, highly harmonizing means 11, and an optical system 12. As shown in FIG. 3, the machine body Z is provided with throttle or restriction means 13 and shutter means 14 within the optical system 12.

The oscillator 10 is provided with a YAG rod 15, a pair of front and rear reflecting mirrors 16 and 16, a Q-switch 17 and an aperture 18, and is arranged such that Q-switch oscillation can be executed by operation of the Q-switch 17. Further, a laser beam B oscillated has a beam diameter which is brought to a constant diameter by the aperture 18. Here, what is "constant diameter" is a diameter which is restricted as far as possible within a range capable of being oscillated by the oscillator 10. In this example, the constant diameter is 1.3 mm.

The highly harmonizing means 11 is provided for highly harmonizing the laser beam B which is oscillated from the oscillator 10 with a wavelength of 1.06 μm. and, in this example, a highly harmonizing means is used which can produce a second high harmonic wave (wavelength: 532 nm).

The optical system 12 comprises a parallelizing optical system 19 which further raises parallelization of the laser beam B from the oscillator 10, a condenser 20 for condensing the laser beam B emitted from the parallelizing optical system 19 into a form of a spot so as to be applied to a workpiece M, and a reflecting mirror 21 provided for changing or altering an optical path through 90° at a location between the parallelizing optical system 19 and the condenser 20.

As shown in FIG. 3, the parallelizing optical system 19 includes an enlarging concave lens 22, a parallelizing convex lens 23, a reducing convex lens 24 and a parallelizing concave lens 25, which are arranged in order from an incident side. The laser beam B passing through the parallelizing optical system 19 is parallelized by the parallelizing convex lens 23 under a condition that the laser beam B is enlarged at a predetermined magnification, in the example, five (5) times by the enlarging concave lens 22, then, is reduced to 1/5 by the reducing convex lens 24 and, subsequently, is parallelized by the parallelization convex lens 25, whereby there is produced a higher degree of parallelization.

The restriction means 13 is provided for further reducing the diameter of the laser beam B oscillated from the oscillator 10 with the diameter of 1.3 mm to further reduce a spot diameter of the spot due to the condenser 20. The restriction means 13 is formed as a plate element having a through bore 26 whose diameter is 1 mm, for example, which is in accordance with a requisite degree of compression into fineness. The restriction means 13 is arranged between the parallelizing convex lens 23 and the reducing convex lens 24 such that a center of the through bore 26 is located at a center of the optical path. The restriction means 13 is so arranged as to intercept or cut off the laser beam B at a portion except for the through bore 26. In this connection, the restriction means 13 is replaced by one different in diameter of the through bore 26 from the restriction means 13, whereby it is possible to change the degree of compression into fineness.

Accordingly, the laser beam B passing through the parallelizing optical system 19 in which the restriction means 13 is interposed is such that a diameter of the parallelizing optical system 19 is restricted mechanically by the restriction means 13 at a location between the parallelizing convex lens 23 and the reducing convex lens 24, and a bad or defective composition at an outer peripheral section is removed. The laser beam B is incident upon the reducing convex lens 24 under a condition of a diameter of 1 mm, for example, in which the defective composition is removed and the laser beam B is further miniaturized. Finally, the laser beam B is brought to a diameter of 0.2 mm, and is incident upon the condenser 20. As a result, there is produced a spot diameter, say, approximately 2~5 μm, which is considerably reduced or is considerably made thin or fine as compared with the conventional one. Processing in which a pattern is directly drawn onto a photomask used in manufacturing of semiconductors of class of four (4) megabits, for example, and further, processing like one in which a pattern is directly drawn onto a substrate of each of the semiconductors are also made possible. In this connection a condition or state of the laser beam B in case where the restriction means 13 is not used is indicated in the figure by two-dot-and-dash-line.

The shutter means 14 is arranged between the parallelizing convex lens 23 and the reducing convex lens 24, similarly to the restriction means 13. The shutter means 14 is provided for executing ON—OFF control of irradiation or application of the laser beam B to the workpiece M. In this manner, the ON—OFF control of application of the laser beam is executed by the shutter means 14 which is arranged on the outside of the oscillator 10, whereby precise or fine processing can further be executed stably. Specifically, by the use of such shutter means 14, it can be dispensed with to execute stopping-starting of the oscillator during processing, so that it is possible to avoid affection or influence of unstabilization of an output at an initial stage of the starting. In this connection, elements known well can be utilized as the detailed arrangements of the shutter means 14, and the description thereof will be omitted.

Here, the reason why the restriction means 13 and the shutter means 14 are arranged between the parallelizing convex lens 23 and the reducing convex lens 24 is to avoid damages of the restriction means 13 and the shutter means 14 due to the laser beam B. Specifically the laser beam B is enlarged five (5) times at a location between the parallelizing convex lens 23 and the reducing convex lens 24 as described previously, and an energy of the laser beam B is reduced to 1/5. For this reason, if the restriction means 13 and the shutter means 14 are arranged here, it can be dispensed with not to damage the restriction means 13 and the shutter means 14.

Figure 4:
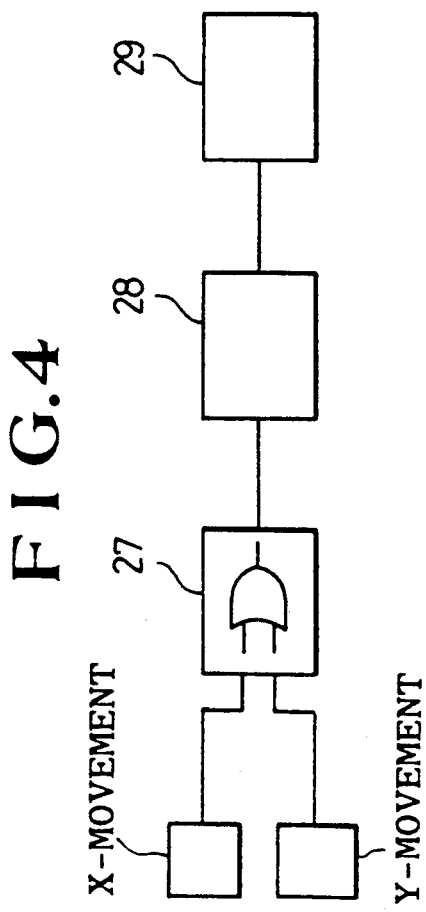
FIG. 4 is a control system view of control means for a laser beam.

The XY-table 3 is provided with control means for the laser beam, as shown in a control system view illustrated in FIG. 4. The control means for the laser beam detects an operating condition of a motor (not shown) that is a drive source for the XY-table 3 or movement of the XY-table 3 by a linear encoder or a rotary encoder. A logical sum or add is taken by an OR circuit 27, regarding data relating to respective X-movement and Y-movement detected and an output thereof is inputted to a laser-application control circuit 29 through an n-time circuit 28.

More specifically pulse signals are obtained in accordance with constant distance intervals regarding the respective X-movement and Y-movement. If there is any one of the pulse signals of the respective X-movement and Y-movement, pulse irradiation or application of the laser beam is executed in accordance with the pulse signal. Interposition of the n-time circuit 28 causes the number of pulses of the laser beam to become n per one pulse signal of each of the X-movement and the Y-movement.

In this manner, the data regarding the X-Y movements are obtained as a pulse signals by the encoder. On the basis of the data, pulse application of the laser beam is controlled, whereby the pulse application of the laser beam can be executed by constant spatial intervals or spacing which are/is regardless of speeds of the respective X-Y movements. Thus, it is possible to avoid a phenomenon called badness or inferiority of a cutting-off condition which is resulted from a change or fluctuation in a moving speed of the workpiece due to unavoidable or inevitable deceleration at a corner section, for example. Furthermore, the data of the X-Y movements are processed by the OR circuit 27 which is capable of executing processing at a considerably high speed as compared with a computer. Accordingly, processing at a higher speed as compared with the conventional arrangement is made possible.

The base disk 4 is formed solid of a stone which is relatively high in specific gravity like granite, for example, and is supported by four (4) legs 31, 31 . . . through intervention of respective air or pneumatic springs 30. In this connection, in this example, each of the pneumatic springs 30 of bellows type is used as "pneumatic spring". However, the invention should not be limited to this, and any other suitable elements may be used.

Such base disk 4 is characterized by the fact that affection or influence of oscillation from surrounding can effectively be cut off. Specifically, an effective oscillation absorbability due to the pneumatic springs 30 and a high oscillation cutting-off ability due to the fact that the base disk 4 is formed solid of the stone organically cooperate with each other so that it is possible to effectively cut off oscillation from surrounding transmitted through a set-up or established floor.

INDUSTRIAL APPLICABILITY

As described above, the YAG laser working machine according to the invention is arranged such that the outer peripheral portion of the laster beam is cut off by the restriction means, whereby the beam diameter is narrowed or reduced and is brought to precise one, that ON-OFF control of application of the laser beam is executed by the shutter means arranged on the outside of the oscillator, whereby the output of the laser beam is stabilized, that the highly harmonizing means is provided to bring the laser beam to harmonization, whereby an attempt can be made to miniaturization and making-into-precision of the diameter of the beam spot, that the base disk is formed of solid stone and is mounted on the legs through intervention of the pneumatic springs, whereby an attempt can be made to improve shakeproofness, and that the data regarding the X-movement and the Y-movement of the XY-table are obtained by the encoder as the pulse signals, and pulse application of the laser beam is controlled on the basis of the data, whereby processing can be made stably at fluctuation of the moving speed of the workpiece and, accordingly, very high-precise processing is made possible such as direct drawing of the pattern onto the photomask which used in the step of manufacturing the printed circuit boards of high packaging density and in the step of manufacturing the semiconductors.

What is claimed is:

1. A YAG laser working machine for a thin film precision processing, comprising a working machine body in which a laser beam oscillated by an oscillator generating a Q-switch oscillation state is led by an optical system having a plurality of lenses, and is condensed in the form of a spot by a condenser arranged at a forward end of the optical system, so as to be applied to a workpiece, an XY-table on which the workpiece is mounted, and a base disk on which said machine body and said XY-table are mounted, characterized in
   that said machine body is provided with restriction means at a location between the plurality of lenses forming the optical system, for cutting off an outer peripheral portion of the laser beam to reduce a beam diameter thereof.

2. A YAG laser working machine according to claim 1, wherein said machine body is provided with a shutter means for executing ON-OFF control of the laser beam application, outside said oscillator.

3. A YAG laser working machine according to claim 1, wherein said machine body is provided with highly harmonizing means for converting the laser beam into a high harmonic wave.

4. A YAG laser working machine according to one of claim 1, wherein said base disk is formed of a solid stone, and is mounted on a plurality of legs by interposition of respective pneumatic springs.

5. A YAG laser working machine according to one of claim 1, further comprising control means in which data regarding X-movement and Y-movement of said XY-table are obtained as pulse signals by an encoder, the data are processed by an OR circuit, and pulse irradiation of the laser beam is controlled on the basis of an output from said OR circuit.

6. A YAG laser working machine comprising a machine body in which a laser beam oscillated by an oscillator generating a Q-switch oscillation state is led by an optical system having a plurality of lenses, and is condensed in the form of a spot by a condenser arranged at a forward end of said optical system, an XY-table on which a workpiece is mounted, and a base disk on which said machine body and said XY-table are mounted, characterized in that said machine body is provided with restriction means at a location between the plurality of lenses forming the optical system, for cutting off an outer peripheral portion of the laser beam to reduce a beam diameter thereof, is provided with a shutter means for executing ON-OFF control of the laser beam application, outside said oscillator, and is further provided with highly harmonizing means for converting the laser beam into a high harmonic wave, that said base disk is formed of a solid stone, and is mounted on a plurality of legs by interposition of respective pneumatic springs, and that said XY-table is provided with control means in which data regarding X-movement and Y-movement are obtained as pulse signals by an encoder, the data are processed by an OR circuit, and pulse irradiation of the laser beam is controlled in response to an output from said OR circuit.

* * * * *